US006720622B1

(12) United States Patent
Yu

(10) Patent No.: US 6,720,622 B1
(45) Date of Patent: Apr. 13, 2004

(54) SCR-ESD STRUCTURES WITH SHALLOW TRENCH ISOLATION

(75) Inventor: Ta-Lee Yu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/189,874

(22) Filed: Jul. 5, 2002

(51) Int. Cl.$^7$ .............................................. H01L 23/62
(52) U.S. Cl. ...................... 257/355; 257/356; 257/360; 257/173; 438/322; 438/336
(58) Field of Search ................. 257/355, 356, 257/360–362, 173, 175, 546; 361/111, 58, 91; 438/322, 323, 325, 336, 353, 355

(56) References Cited

U.S. PATENT DOCUMENTS

| 5,012,317 A | | 4/1991 | Rountre ........................ 357/38 |
| 5,517,051 A | * | 5/1996 | Chatterjee ................... 257/360 |
| 5,530,612 A | | 6/1996 | Maloney ...................... 361/56 |
| 5,629,544 A | | 5/1997 | Voldman et al. ............. 257/355 |
| 5,903,424 A | | 5/1999 | Tailliet ........................ 361/111 |
| 6,169,310 B1 | * | 1/2001 | Kalnitsky et al. ........... 257/355 |
| 6,172,403 B1 | | 1/2001 | Chen ........................... 257/355 |
| 6,236,087 B1 | | 5/2001 | Daly et al. ................... 257/355 |
| 6,268,639 B1 | * | 7/2001 | Li et al. ....................... 257/577 |
| 6,498,357 B2 | * | 12/2002 | Ker et al. .................... 257/173 |

FOREIGN PATENT DOCUMENTS

JP         2002094001 A    *  3/2002

* cited by examiner

*Primary Examiner*—Nathan J. Flynn
*Assistant Examiner*—Remmon R. Fordé
(74) *Attorney, Agent, or Firm*—George O. Saile; Stephen B. Ackerman

(57) ABSTRACT

A novel device structure and process are described for an SCR ESD protection device used with shallow trench isolation structures. The invention incorporates an SCR device with all SCR elements essentially contained within the sane active area without STI elements being interposed between the device anode and cathode elements. This enhances ESD performance by eliminating thermal degradation effects caused by interposing STI structures, and enhances the parasitic bipolar characteristics essential to ESD event turn on. Enabling this unique design is the use of an insulation oxide surface feature which prevents the formation of contact salicides in unwanted areas. This design is especially suited to silicon-on-insulator design, as well as conventional SCR and LVTSCR designs.

7 Claims, 4 Drawing Sheets

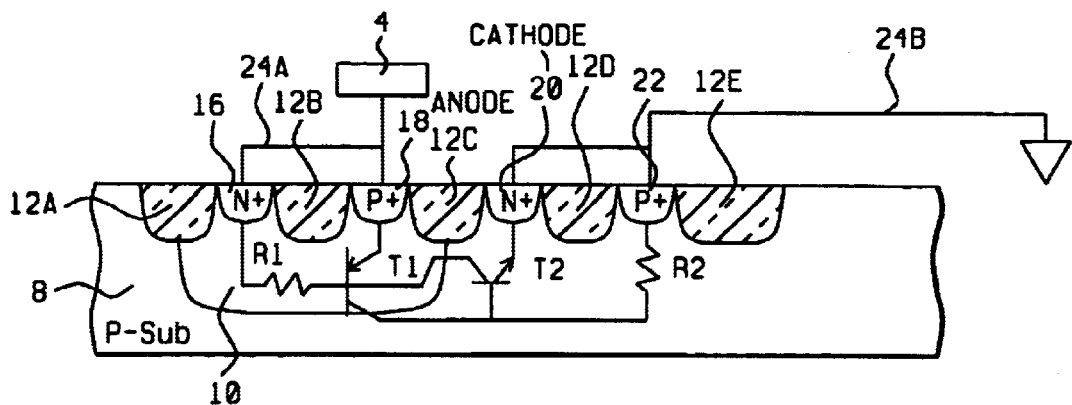
FIG. 1A – Prior Art
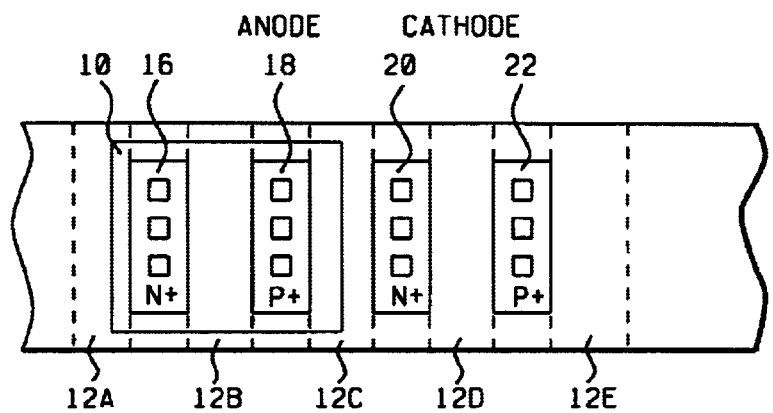
FIG. 1B – Prior Art
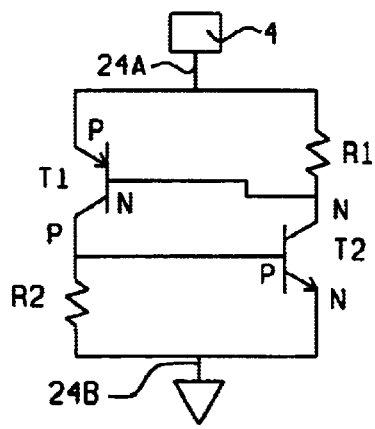
FIG. 1C – Prior Art

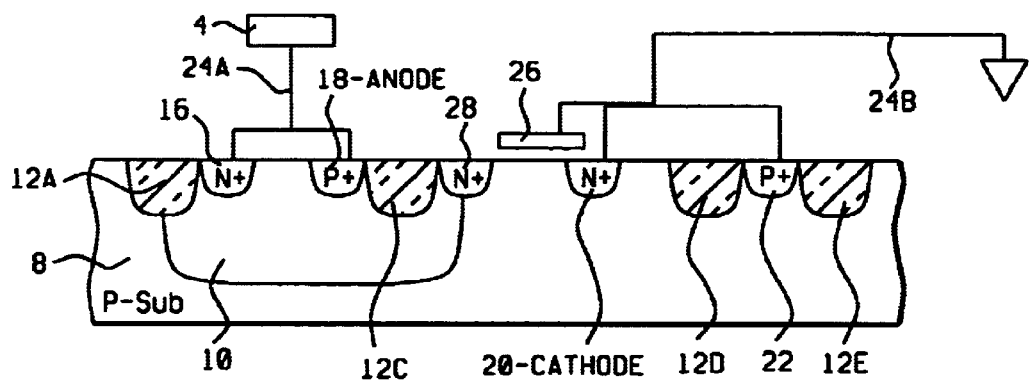
FIG. 2 – Prior Art
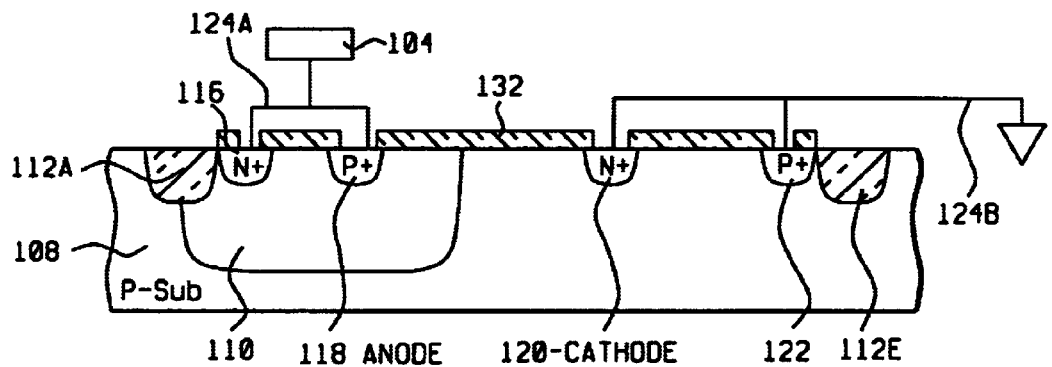
FIG. 3A
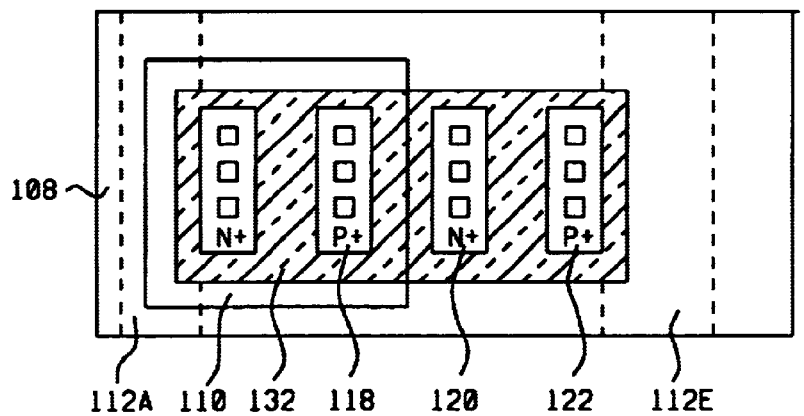
FIG. 3B

SCR-ESD STRUCTURES WITH SHALLOW TRENCH ISOLATION

BACKGROUND OF THE INVENTION (1) Field of the Invention

The present invention relates generally to a structure and process for a semiconductor device which provides improved ESD protection for internal active semiconductor devices and more particularly to a semiconductor SCR like device which when used with shallow trench isolation, provides improved parasitic bipolar characteristics resulting in improved ESD protection performance.

(2) Description of Prior Art

The discharge of electrostatic energy from the human body or other sources known as electrostatic discharge (ESD) into the input or output pads of integrated circuit semiconductor devices has shown to cause catastrophic failures in these same circuits. This is becoming more important as modem metal oxide semiconductor (MOS) circuit technology is scaled down in size and increased in device and circuit density. Prevention of damage from ESD events is provided by protection devices or circuits on the input or output pads of the active logic circuits which shunt the ESD energy to a second voltage source, typically ground, thereby bypassing the active circuits protecting them from damage. Various devices such as silicon controlled rectifiers (SCR) have been utilized to essentially shunt the high ESD energy and therefore the ESD stress away from the active circuits.

Isolation is required between these ESD protection devices and the active circuit devices, as well as between the active devices themselves. Originally areas of local thick oxide, often called LOCOS or field oxide, have been used to provide this isolation. While having good isolation properties, this isolation method uses more surface area, or "real estate", than an alternative isolation method using shallow, relatively narrow trenches filled with a dielectric, typically silicon oxide ($SiO_2$), called shallow trench isolation (STI).

While providing good isolation properties, the STI structure has limiting effects on the current triggering and capacity of the SCR ESD protection devices. During STI formation, the STI region is exposed to the etching process, leading to non-plan STI edges where the silicon region extends above the isolation edge. The non-planer STI edge is called "STI pull-down". The impact of STI pull-down, and the interaction with the silicide process typically used in current contact technology, as well as junction depth reduction of the diode elements bounded by the STI devices, all degrade ESD protection capabilities by reducing the parasitic bipolar current gain, beta, (B). This increases the holding voltage and trigger current of the lateral SCR, reduces lateral heat transfer capability, and possibly limits the type of ESD networks implemented Among other things, this can result in device failure before the SCR is fully on, or a high on-resistance for the SCR reducing the ESD failure threshold.

FIG. 1A is a simplified cross section of a typical prior art SCR ESD protection device Shown is a P substrate 8, with an N-well 10 and which contains contact regions N+ 16 and P+ 18. The N-well 10 contact regions are isolated and bounded by the shallow trench isolation (STI) structures 12A, 12B and 12C. The N-well 10 is also bounded by STI elements 12A and 12C. The P substrate 8 also contains N+ contact 20 bounded by STI elements 12C and 12D, and P+ contact 22 bounded by STI structures 12D and 12E. Also depicted in FIG. 1A are parasitic vertical PNP bipolar transistor T1 and lateral NPN bipolar transistor T2 with parasitic resistors R1 and R2. The P+ contact 18 is the anode end of the device and is connected to the active circuit input or output pad 4 as well as to the N-well N+ contact 16 by conductor 24A.

The junction between the P+ contact region 18 and the N-well 10 is the first junction of the SCR, and the P+ contact region 18 forms the SCR device anode. The N-well 10 and the P substrate 8 form the second junction. The third device junction is formed by the P substrate 8 and substrate N+ contact 20, which also is the cathode terminal of the device. N+ contact 20 is connected to a second voltage source, typically ground, and also to substrate P+ contact 22 by conductor element 24B.

FIG. 1B shows the horizontal topography of the prior art device showing the N-well 10 with associated N+ contact 16, P+ contact 18, and related STI structures 12A, 12B, and 12C represented by the dashed lines. Also represented in FIG. 1B are the substrate N+ contact 20 and P+ contact 22 as well as the STI 12D and 12E. The contact elements often use a silicide, or salicide, to improve the silicon to metal contact conductivity. The salicides are typically formed from refractory metals such as titanium (Ti), tungsten (W), tantalum (Ta), or molybdenum (Mo). The typical process is to provide a barrier such as $SiO_2$ to prevent salicide formation in unwanted areas, deposit the metal followed by a heat process, to form the salicide, and then remove the metal from the unwanted or non-contact areas.

FIG. 1C represents the electrical schematic of the prior art device showing the parasitic vertical bipolar PNP transistor T1 and parasitic lateral NPN bipolar transistor T2 as well as the resistors R1 and R2. A positive ESD voltage event will cause the T1 base-collector junction to go into avalanche conduction, turning on T2 and providing the regenerative conduction action shunting the ESD current to the second voltage source, typically ground. A negative ESD voltage pulse will forward bias the base-collector junction of T1, which is formed by the N-well 10 and P-substrate 8 junction, again shunting the current to the second voltage source.

However, for positive ESD events as indicated above, the STI isolation structures inhibit lateral current conduction near the surface, lower the parasitic bipolar semiconductor current gain, and can interfere with device thermal characteristics.

FIG. 2 represents another prior art protection device, a low voltage trigger SCR (LVTSCR). There is no STI between the N-well N+ contact 16 and SCR P+ anode 18, and the STI structure 12C formerly straddling the N-well 10 and Substrate 8 boundary has been shifted to the left and a N+ region 28 has been added straddling the lateral boundary. A FET gate 26 has been inserted bete the N+ region 28 and the N+ region 20 which essentially become the drain and source of a NFET respectively. The NFET source region 20 also functions as the SCR cathode. The prior art LVTSCR device operational trigger voltage is reduced by the NFET device breakdown voltage. The remaining STI elements still reduce the desirable ESD protection characteristics as previously discussed.

The invention in various embodiments allows the reduced use of STI elements while improving ESD protection by the use of an oxide layer, often called resistor protection oxide, for a silicide block The following patents describe ESD protection devices.

U.S. Pat. No. 6,172,403 (Chen) shows an ESD circuit with a process involving AA, isolation areas, and silicide.

U.S. Pat. No. 5,012,317 (Rountie=) shows a conventional SCR-ESD circuit protection device with parasitic bipolar transistors.

U.S. Pat. No. 5,629,544 goldman et al.), U.S. Pat. No. 6,236,087 (Daly et al.), U.S. Pat. No. 5,903,424, (Taillliet and U.S. Pat. No. 5,530,612 (Maloney) are related ESD patents.

The following technical reports discuss ESD protection circuits and STI bound ESD protection networks.

"Basic ESD and I/O Designed" by S. Dabral et al., 1998 pps 38, 57, 62, and 247.

"Designing Power Supply Clamps for Electrostatic Discharge Protection of integrated Circuits" by T. J. Maloney, Microelectronics Reliability 38 (1998) pp. 1691–1703.

SUMMARY OF THE INVENTION

Accordingly, it is the primary objective of the invention to provide a novel, effective structure and manufacturable method for protecting integrated circuits, in particular field effect transistor devices, from damage caused by electrostatic discharge (ESD) events during normal operation.

It is a further objective of the invention to improve ESD protection involving SCR elements employing shallow trench isolation (STI).

It is yet another object of the invention to provide an ESD protection structure while maintaining the required operating characteristics of the active devices being protected.

The above objectives are achieved in accordance with the embodiments of the invention that describes a novel structure and process for a SCR like ESD protection device. The device is situated on a semiconductor substrate, typically P doped, and containing a N-well with P+ and N+ contact regions. A STI structure straddles one N-well to substrate lateral boundary. The same STI abuts the N-well N+ contact region lateral boundary near the substrate surface. A second STI structure defines a device lateral boundary near the surface for the P+ substrate contact.

A N-well P+ contact and a N+ substrate contact are also defined. The N-well P+ element forms the anode of the SCR device, and is electrically connected to the N+ N-well contact and to the active logic device input or output pad. The substrate N+ element form the SCR cathode and is electrically connected to the substrate P contact and to a second voltage source, typically ground.

A feature of the invention is the use an oxide element in strategic locations on the substrate surface, often called resistor protection oxide (RPO), in place of the STI elements, to mask off silicide from areas where it is not desired This enables the use of fewer STI elements, improving the ESD characteristics of the SCR ESD protection device.

In alternative invention embodiments, the RPO is utilized in low voltage trigger SCR (LVTSCR) devices and also in silicon on insulator (SOI) device design.

BRIEF DESCRIPTION OF THE DRAWINGS

FIG. 1A is a cross sectional representation of a prior art SCR ESD protection device structure showing the isolation elements and parasitic bipolar elements.

FIG. 1B is a representation of the horizontal topography of the prior art SCR ESD protection device.

FIG. 1C represents the electrical schematic of the prior art SCR ESD protection device.

FIG. 2 represent a prior art low voltage trigger SCR (LVTSCR) protection device cross section.

FIG. 3A is a representation of the cross section of one embodiment of the invention for a SCR ESD protection device.

FIG. 3B is top view of one embodiment of the invention for a SCR ESD protection device. Showing the horizontal topography of the invention.

DESCRIPTION OF THE PREFERRED EMBODIMENTS

Figure 4:
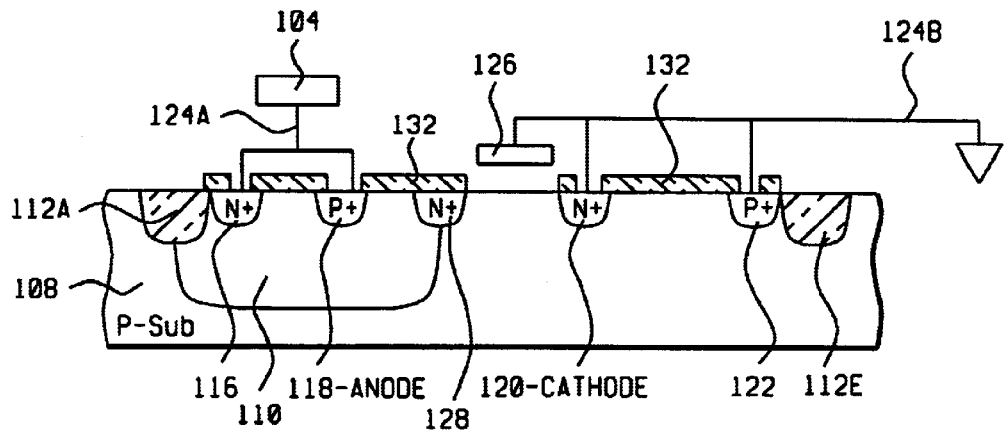
FIG. 4 is a simplified cross section of another embodiment of the invention for a LVTSCR.

FIG. 3A shows a simplified cross section of one embodiment of the invention for a basic SCR. A P doped substrate 108 with optical doping concention of between 1E14 and 1E16 atoms/cm$^3$ (a/cm$^3$) contains an N-well 110 with a typical dopant concentration between 1E16 and 1E18 a/cm$^3$. The N-well 110 is bounded at and near the surface by shallow trench isolation (STI) element 112A, typically between 0.2 to 1 um wide and 0.4 to 2 um deep. The STI element 112A and 112E filled with a dielectric, typically silicon oxide (SiO$_2$) It should be noted that the invention SCR device does not require the STI elements 12B, 12C and 12D required for the Prior Art device shown in FIG. 1A. Within the N-well 110 region are a N+ 116 and P+ 118 contact regions, with typical dopant concentrations of between 1E19 and 1E21 a/cm$^3$. The N+ region 116 is bounded on the side away from the P+ contact 118 by the STI 112A. The substance 110 has N+ contact 120 and P+ contact 122, with a typical dopent concentiaion of between 1E19 and 1E21 a/cm$^3$ of donor and receptor dopant respectively. The outside edge of substrate P+ contact 122 is bounded by STI element 112E.

The N-well N+ region 116 and P+ region 118 typically have specific contact amas where the silicon to metallurgy interface contains a salicide to reduce contact resistance. The salicides are typically formed from refractory metals such as titanium (Ti), tungsten (W), tantalum (Ta), or molybdenum (Mo). There is a blanket metal evaporation followed by a thermal annealing process, typically done at a temperature between 450 and 650° C., that forms the salicide. Unwanted unreacted metal is then selectively removed by use of an etchant that does not attack the salicide, the silicon substrate or the SiO$_2$. A typical substance used for this etchant is a mixture of deionized water, hydrogen peroxide (H$_2$O$_2$), and ammonium hydroxide (NH$_4$OH) in a 5:1:1 mixture. Following the removal of reacted metal, typically a stabilization anneal is performed with a temperature of between 800 and 900° C. to further reduce resistivity.

A unique feature of the invention is a protective oxide layer 132, often called resistor protection oxide (RPO), overlaying the surface in non-contact areas, between the N-well N+ contact 116, P+ contact 118, and subs N+ contact 120 and substrate P+ contact 122. The oxide 132 is thermally deposited to a thickness between 1000 and 3000 Å. This oxide is a barrer or mask to prevent the salicide used to reduce the contact resistance between the silicon and the metallurgy system, typically aluminum or aluminum doped with silicon, from being formed in or on unwanted areas.

The RPO layer enables the proper device salicide processing without having to use the STI elements of prior art. As previously discussed, the STI elements can be detrimental to the ESD protection capability of the device by reducing the parasitic bipolar current gain, beta, (B), and can also reduce lateral heat transfer capability.

Processing is continued in a conventional manner to complete the devices on the substrate. The P+ contact 18 is the anode of the SCR device, and is electrically connected to the N+ contact 116, and the active device input or output pad 104 by conductor 124A. The N+ contact 120 is the SCR cathode and is electrically connected to the substrate P+ contact 122, and a second voltage source, typically ground, by conductor 124B. Not shown in the figure for clarity, but typically the device surface is covered by a passivity layer, either $SiO_2$ or silicon nitride ($Si_3N_4$), or a borophosphorus silica glass with a thickness of between 3000 and 7000 Å for protection against scratching, moisture or other damage.

FIG. 3B shows the device horizontal topography with the RPO depicted by the area 132. It is noted that the invention does not require the prior art STI elements 12B, 12B, 12C and 12D, as depicted by the dotted lines in the plan view of prior art FIG. 1B.

Another embodiment of the invention is shown in FIG. 4. The unique design of the invention further improves the ESD protection of a LVTSCR device by enabling the elimination of STI elements 12C and 12D shown in FIG. 2 for prior art. The N+ doped region 128 straddling the latent boundary between the N-well 110 and the substrate 108 has a dopant concentration typically between 1E19 and 1E21 a/cm$^3$. This N+ difussion region 120 serves as the drain of a N-channel thin oxide field effect transistor (FET) with associated gate 126. The FET N+ drain 128 connects internally to the N region N-well 110 base of the SCR and the FET N+ source 120, which also serves as the SCR cathode. The cathode 120, FET gate 126, and substrate P+ contact 122 are connected to a second voltage source, typically ground, by conductor 124B. This arrangement has the effect of lowering the trigger voltage of the SCR by the design of the channel length and/or the gate oxide thickness of the FET to provide a LVSCR element. The N-well P+ contact 118 is the device anode and is connected to the N-well N+ contact 116 and the active circuit I/O pad by conductor 124A.

The unique structure of the invention design places a protective oxide layer 132, or RPO layer, over the device surface except for the specific contact areas, to prevent the formation of salicide in areas not required. This eliminates the need for the prior art STI structures shown in FIG. 2 as STI elements 12B and 12C between the SCR anode and cathode. Again, the elimination of these STI improves the ESD performance of the SCR device.

Again, not shown in the figure for clarity, but typically the device surface is covered by a passivation layer, either $SiO_2$ or silicon nitride ($Si_3N_4$) or a borophosprus silicate glass with a thickness of between 3000 and 7000 Å to provide device protection.

Figure 5:
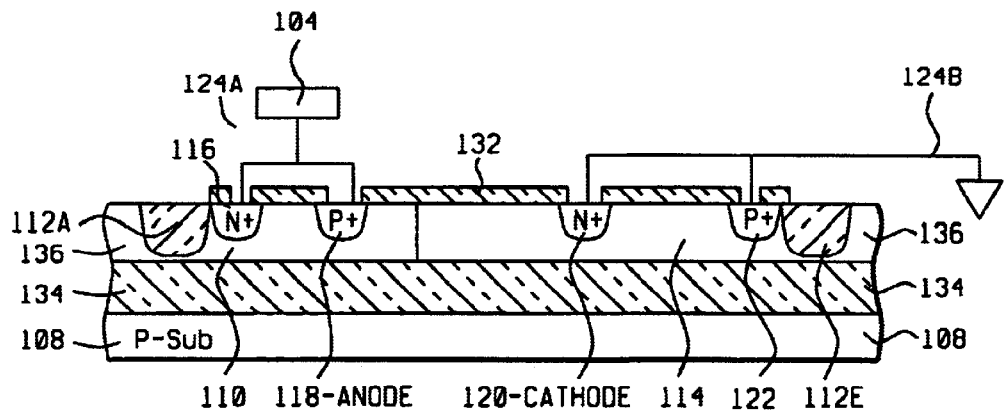
FIG. 5 is a simplified cross sectional representation of another embodiment of the invention for a silicon on insulator device design.

In yet another embodiment depicted in FIG. 5, the invention is applied to a silicon on insulation (SOI) SCR protection device. There are several techniques in achieving an SOI structure well known in the art such as using sapphire as the insulator or using oxide as the insulator by using a heavy oxygen implant to create the oxide layer. As depicted in FIG. 5, a silicon wafer 108 has received an implant of oxygen to form a buried layer of $SiO_2$ 134 as the insulation layer below the wafer surface. Typically, a high dosage of oxygen ions (O$^+$), between 1E18 and 5E18 a/cm$^2$ with an implant energy between 150 and 180 KeV is used to create the insulation layer. The insulation layer is typically between 0.3 and 0.5 microns below the surface. The wafer is typically heated between 350 and 450° C. during the implant process to insure that the surface maintains its crystallinity. A post implant anneal is performed at a temperature between 1050 and 1200° C. for 3 to 5 hours to form the buried layer of $SiO_2$. The anneal step also allows excess oxygen in the surface silicon to out-diffuse, increasing the dielectric strength of the buried oxide layer. After the anneal, an additional layer of epitaxial silicon is deposited to assure that a single crystal active device region 136 of at least 0.5um or greater in depth exists for the fabrication of active devices.

The use of trench isolation with SOI technology can be estrictive as the trench can contact the insulation element. When STI elements are used for isolation between SCR elements this can completely block device current flow around STI regions located between the SCR anode and cathode.

As depicted in FIG. 5 the invention embodiment for SOI technology, the SCR structure is composed of an N-well 110 with N+ contacts 116 and SCR anode P+ contact 118. Adjacent to the N-well 110 is a P-well 114 with N+ contact 120 forming the device cathode and a P+ contact 122. The heavily doped electrical contact areas typically contain a silicide or salicide between the silicon surface and the aluminum metallurgy conductor elements 124A and 124B. The SCR device is bounded on one side by STI element 112A and on the other side by STI element 112E, and there are no STI elements within the SCR active device area. The device anode 118 is electrically connected to the N-well 110 P+ contact 116 and the I/O node 104 by a metallurgical conductor element 124A, typically aluminum, or silicon doped aluminum. The device cathode 120 is electrically connected to the P-well 114 P+ contact 122 and a second voltage source, typically ground, by a similar metallurgical conductor element 124B. The electrical contact at the silicon surface typically contains a refractory metal salicide, such as $TiSi_2$, to reduce electrical contact resistivity and prevent unwanted metallurgical annealing with the silicon.

As shown in FIG. 5, this invention embodiment provides an insulating RPO layer 132 on the device surface in non-contact areas to prevent salicide formation in these areas. This feature enables the reduction in the use of STI structures improving device ESD performance, or enabling an SCR ESD protection structure in situations not possible before. As in other embodiments, the N-well N+ contact 116, N-well 110, P-well 114 and P-well P+ contact 122, effectively form a PN diode that is useful for shunting negative ESD energy occurring at the input terminal 104 away from the active devices.

Not shown in the figure for clarity, but the device surface is typically covered by a passivation layer, either $SiO_2$ or silicon nitride ($Si_3N_4$), or a borophosphorus silicate glass with a thickness of between 3000 and 7000 Å.

Figure 6:
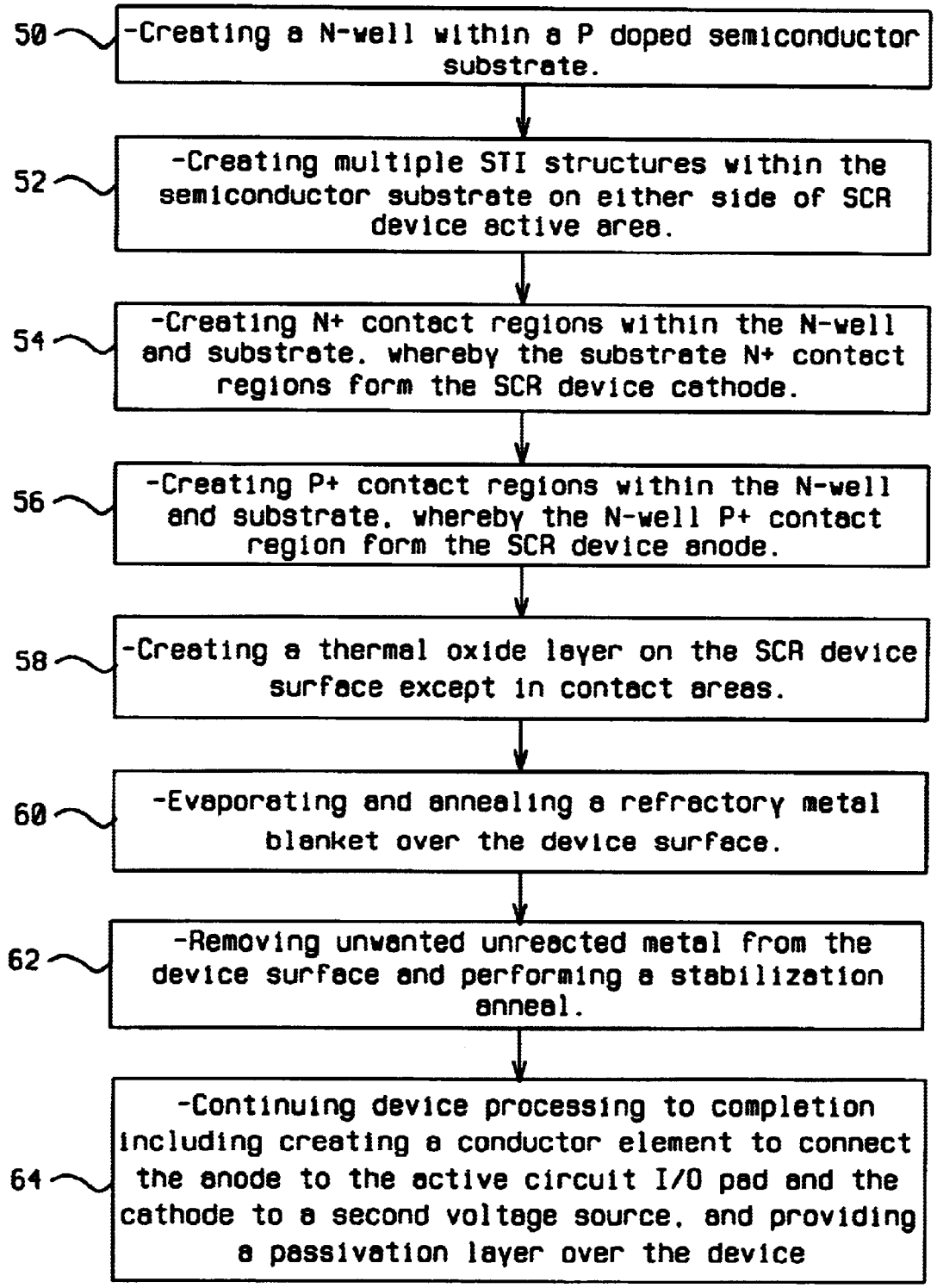
FIG. 6 is a flow diagram of the invention process.

The process to develop an embodiment of the invention for a basic SCR as shown in FIG. 3A on a P doped silicon substrate is outlined in the flow diagram of FIG. 6. This embodiment of the invention requires only 2 STI elements as apposed to 5 as shown in Prior Art FIG. 1A Starting with a P doped substrate, a N-well. FIG. 6 element 50 is created, typically by doping with an implant of phosphorous (P) with a dosage between 1E15 and 1E18 atoms/cm$^2$ and with an energy of between 30 and 80 KeV to produce an N-well with a dopant concentration of between 1E16 and 1E18 a/cm$^3$. The creation of the 2 STI elements is described in FIG. 6 element 52. The STI elements are typically formed using an etching process such as a dry an isotropic plasma etch to form the trenches to a depth between 0.4 and 2 um deep and between 0.2 and 1 um wide. The trenches are then filled with a dielectric, typically $SiO_2$, by LPCVD, or by an APCVD, or by a high-density plasma process. After filling, the STI elements are planarize by either an etch process, or, more typically, a chemical mechanical polish (CMP) process.

As indicated in FIG. 6, the creation of the N+ contact regions 54 is done by using a donor element such as arsenic (As), with a dosage level between 1E13 and 1E15 a/cm$^2$, and with an energy between 20 and 40 KeV. This results in contact dopant regions with a concentration of between 1E19 and 1E21 a/cm$^3$. The P+ contact regions in the N-well and substrate are similarly created by an implant process but using an accepter element, typically boron (B), with a dosage of between 1E12 and 1E13 a/cm$^2$, and an implant energy of between 40 and 80 KeV resulting in a dopant concentration of between 1E19 and 1E21 a/cm$^3$.

As indicated by the flow element 58 in FIG. 5, the creation of the thermal oxide layer 58 is typically done with a thermal process at a temperature of between 700 and 1100° C. The oxide, frequently called resistor protection oxide, is etched at the appropriate contact areas to open the oxide to the contact regions. The refractory metal evaporation 60, is performed to produce a blanket of the metal, typically metal such as titanium (Ti), tungsten (W), tantalum (Ta), or molybdenum (Mo).

After the evaporation, an anneal is done at temperatures between 450 and 650° C. to form the salicide in the contact areas. Removing unwanted unreacted metal 62 from the device is typically done by an etch such as a mixture of DI $H_2O$, 30% $H_2O_2$, and $NH_4OH$ in a 5:1:1 mixture. A stabilization anneal is performed at a temperature between 800 and 900° C. Continued device processing 64 includes creating conductor elements by evaporating metal, typically aluminum doped with 1% silicon, patterning and etching to remove metal from unwanted areas, and providing a passivation layer such as $SiO_2$, or silicon nitride (SiN), or borophosphorus silicate glass (BPSG). For BPSG, deposited $SiO_2$ is doped with boron from a diborane source and doped with phosphorous from a phosphine source at a temperature between 400 and 500° C. followed by a densification between about 700 and 900° C. to form BPSG.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a silicon controlled rectifier electrostatic discharge protection device with fewer required STI elements on a semiconductor substrate comprising:

forming a first doped region of opposite dopant than said substrate extending down from the surface of said substrate;

creating multiple isolation elements within said semiconductor substrate on either side of said silicon controlled rectifier device active area;

forming a heavily doped second region with associated electrical contact area within said first doped region of similar dopant to said first doped region and forming a similar doped fourth region within the substrate area;

forming a heavily doped third region with associated electrical contact area within said first dop region of opposite doping than said first doped region, and forming a similar doped fifth region in the substrate area;

forming a first insulation layer on the surface of said silicon controlled rectifier device everywhere except for said electrical contact areas;

Evaporating and annealing a refractory metal blank over said silicon controlled rectifier device surface including on top of said first insulation surface layer;

Removing unwanted said refractory metal from said silicon controlled rectifier device surface non-electrical contact areas and performing a stabilization anneal;

continuing said silicon controlled rectifier device processing to completion including creating first and second conductor elements and a passivation layer.

2. The method according to claim 1, whereby said first doped region is donor doped with phosphorous with a dosage between E15 and E17 a/cm$^2$ with an energy between 30 and 80 KeV to produce a N-well.

3. The method according to claim 1 whereby said second and fourth heavily doped regions with associated contact areas are doped with a donor dopant such as arsenic with a dosage between 1E13 and 1E15 a/cm$^2$ and an energy level between 20 and 40 KeV.

4. The method according to claim 1 whereby said third and sixth heavily doped regions are doped with an acceptor dopant such as boron with a concentration of between 1E12 and 1E13 a/cm$^2$ and with an energy level between 40 and 80 KeV.

5. The method according to claim 1 whereby said first insulating layer is thermally grown $SiO_2$ at a temperature between 700 and 1100° C. to a thickness between 1000 and 3000 Å.

6. The method according to claim 1 whereby said refractory metal blanket consists of titanium or tungsten or tantalum or molybdenum.

7. The method according to claim 1 whereby said conducting elements are comprised of aluminum or similar metallurgical material.

\* \* \* \* \*